(12) United States Patent
Liu et al.

(10) Patent No.: US 7,579,668 B2
(45) Date of Patent: Aug. 25, 2009

(54) METHOD FOR PHOTO-DETECTING AND APPARATUS FOR THE SAME

(75) Inventors: Chee-Wee Liu, Taipei (TW);
Chun-Hung Lai, Taipei (TW);
Meng-kun Chen, Taipei (TW);
Wei-Shuo Ho, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 11/875,287

(22) Filed: Oct. 19, 2007

(65) Prior Publication Data

US 2009/0008736 A1      Jan. 8, 2009

(30) Foreign Application Priority Data

Jul. 5, 2007      (TW) .............................. 96124547 A

(51) Int. Cl.
*H01L 31/06* (2006.01)
*H01L 27/148* (2006.01)
*H01L 29/768* (2006.01)
*H01L 31/062* (2006.01)
*H01L 31/113* (2006.01)

(52) U.S. Cl. ....................... 257/461; 257/233; 257/292; 257/463; 257/464; 257/E25.032; 257/27.133; 257/E31.058; 257/E31.063; 257/E31.115

(58) Field of Classification Search ................. 257/233, 257/292, 461, 463–464, E25.032, E27.133, 257/E31.058, E31.063, E31.115
See application file for complete search history.

(56) References Cited

U.S. PATENT DOCUMENTS

| | | | | | |
|---|---|---|---|---|---|
| 3,863,334 | A | * | 2/1975 | Coleman | 438/558 |
| 4,200,877 | A | * | 4/1980 | Suzuki et al. | 257/49 |
| 5,412,229 | A | * | 5/1995 | Kuhara et al. | 257/183 |
| 5,488,251 | A | * | 1/1996 | Mizutani et al. | 257/557 |
| 5,965,875 | A | * | 10/1999 | Merrill | 250/226 |
| 6,043,517 | A | * | 3/2000 | Presting et al. | 257/184 |
| 6,417,074 | B2 | * | 7/2002 | Kopley et al. | 438/448 |
| 6,483,116 | B1 | * | 11/2002 | Kozlowski et al. | 250/372 |
| 6,633,071 | B1 | * | 10/2003 | Furio | 257/383 |
| 6,953,925 | B2 | * | 10/2005 | Fang et al. | 250/214.1 |
| 6,956,273 | B2 | * | 10/2005 | Koizumi | 257/440 |
| 7,009,680 | B2 | * | 3/2006 | Cavanaugh et al. | 349/196 |
| 2004/0211885 | A1 | * | 10/2004 | Kohno et al. | 250/214.1 |
| 2006/0215048 | A1 | * | 9/2006 | Suzuki | 348/272 |
| 2007/0099328 | A1 | * | 5/2007 | Chiang et al. | 438/57 |

* cited by examiner

*Primary Examiner*—Ida M Soward
(74) *Attorney, Agent, or Firm*—Volpe and Koenig, PC

(57) ABSTRACT

A method for photo-detecting and an apparatus for the same are provided. The apparatus for photo-detecting includes a first P-N diode and a second P-N diode. The first P-N diode, has a first P-N junction which has a first thickness, by which a first electrical signal is generated when irradiated by light, and the second P-N diode has a second P-N junction which has a second thickness, by which a second electrical signal is generated when irradiated by light. The second thickness is larger than the first thickness and an operation of the first electrical signal and the second electrical signal is proceeded for obtaining a third electrical signal.

16 Claims, 5 Drawing Sheets

METHOD FOR PHOTO-DETECTING AND APPARATUS FOR THE SAME

FIELD OF THE INVENTION

The present invention relates to an apparatus for photo-detecting and a method for the same, and more particularly to an apparatus using a photodiode for photo-detecting and a method for the same.

BACKGROUND OF THE INVENTION

Photosensors are widely used in modern society, including in digital camera sensors, scanner, optical communication elements, fire detectors, and so on. It is a long-felt need in this art to develop photo sensors being better responsive to some certain wavelengths. For example, the detection of different colors (which are usually the primary colors of red, green and yellow) by digital camera sensors is processed via applying different color filters, which increases cost but reduces the responsivities to light within certain spectrum.

Another kind of element that is usually used in photo-detecting is the diode. When a voltage applied across a junction of the diode is reverse biased, a depletion region would be formed at the junction. The depletion region has a well ability to store the energy absorbed from light as electron-hole pairs, and the greater thickness the junction has, the shorter wavelength the light absorbed will be. The diode's surface could be further processed to decrease the responsivity to short wavelengths, which makes the silicon-based diode has a responsivity to light mainly within the spectrum of near-infrared. The silicon-base P-N diodes are low-cost, and the traditional photo diodes usually adopt N-well P substrate as basic structures. Although the traditional silicon-based P-N diodes have a well responsivity to light within the spectrum of the infrared, especially the near infrared, they don't have an ideal responsivity to the visible light, especially bad to light of the short wavelengths (450 nm-550 nm).

In order to overcome the drawbacks in the prior art, a method for photo-detecting and an apparatus for the same are provided. The particular design in the present invention not only solves the problems described above, but also is easy to be implemented. Thus, the invention has the utility for the industry.

SUMMARY OF THE INVENTION

In accordance with the present invention, there is provided a P-N junction photodiode. The P-N junction photodiode includes a first P-N diode and a second P-N diode. The first P-N diode has a first P-N junction which has a first thickness, by which a first electrical signal is generated when irradiated by light, and the second P-N diode has a second P-N junction which has a second thickness, by which a second electrical signal is generated when irradiated by light. The second thickness is larger than the first thickness and an operation of the first electrical signal and the second electrical signal is proceeded for obtaining a third electrical signal.

Preferably, the P-N diodes include an N-type well formed on a P-type substrate.

Preferably, the P-N diodes are silicon-based P-N diodes formed by P-type silicon substrate or N-type silicon substrate.

Preferably, the P-N diodes are germanium-based P-N diodes formed by {100}, {110} or {111} germanium substrates.

Preferably, the P-N diodes are PN diodes, PIN diodes, MIS diodes or MSM diodes.

Preferably, the first thickness is ranged from 10 nm to 3 μm and the second thickness is ranged from 10 nm to 4 μm.

Preferably, the first P-N diode further includes an anti-reflection layer disposed on a surface of the first P-N diode.

Preferably, the anti-reflection is made of $SiO_2$ or $Si_3N_4$.

Preferably, the second P-N diode further includes a defective area formed on a surface of the second P-N diode.

Preferably, the defective area is formed by an ion implantation or a reactive ion etching (RIE).

Preferably, the first P-N diode has a light receiving area equal to that of the second P-N diode.

Preferably, the first P-N diode has a doping concentration equal to that of the second P-N diode.

Preferably, the P-N junction photodiode further includes an operation circuit.

Preferably, the operation is a subtraction operation.

Preferably, The P-N junction photodiode further includes an ohmic contact electrode on respective surfaces of the first P-N diode and the second P-N diode.

In accordance with another aspect of the invention, there is provided a method of photodetecting. The method includes steps of providing a first P-N diode having a first P-N junction having a first depth, providing a second P-N diode having a second P-N junction having a second depth, irradiating a light on the first P-N diode and the second P-N diode for generating a first electrical signal and a second electrical signal, respectively, and receiving the first and second electrical signals to generate a third electrical signal.

In accordance with a further aspect of the present invention, a photosensor is provided. The photosensor includes a first photodetector and a second photodetector. The first photodetector has a first junction having a first thickness, by which a first electrical signal is generated when irradiated by light, and the second photodetector has a second junction having a second thickness, by which a second electrical signal is generated when irradiated by light. Further, the second thickness is larger than the first thickness.

Preferably, the first photodetector and the second photodetector are selected from PN diodes, PIN diodes, MIS diodes, or MSM diodes.

Preferably, the photosensor further includes an operation circuit.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
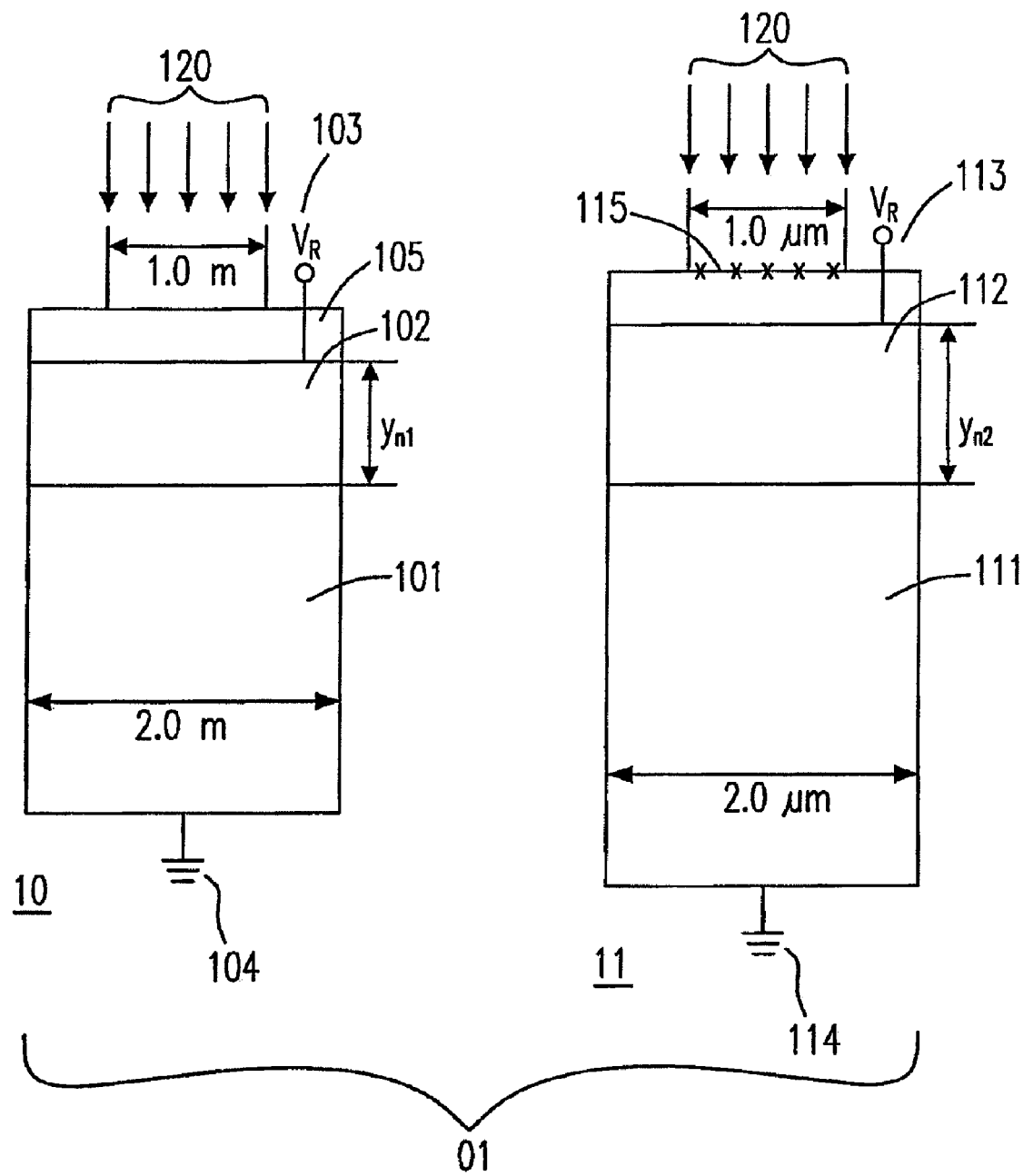
FIG. 1 is an illustrating diagram showing a photosensor according to the first preferred embodiment of the present invention.

Please refer to FIG. 1, which is an illustrating diagram showing a photosensor according to the first preferred embodiment of the present invention. The photosensor 01 of the present invention includes a first P-N diode 10 and a second P-N diode 11. The first P-N diode 10 has a first P-typed substrate 101, and the doped concentration thereof is 7E14 $(cm^{-2})$. Further, a first N well 102 is formed on the first P-typed substrate 101 to produce a first P-N junction, and the doped concentration of the first N well 102 is 1E17 $(cm^{-2})$. The thickness Yn1 of the first P-N junction is 0.7 μm. Moreover, a first reverse-biased contact electrode 103 is plated on the surface of the first N well 102, and a first ohmic contact electrode 104 is formed on the surface of the first P-typed substrate 101. The first ohmic contact electrode 104 is grounded, and an anti-reflection layer 105, which is made of $SiO_2$ or $Si_3N_4$, is disposed on the reverse-biased contact electrode 103.

The second P-N diode 11 has a second P-typed substrate 111, and a second N well 112 is formed thereon. Further, a second reverse-biased contact electrode 113 is plated on the surface of the second N well 112, and a second ohmic contact electrode 114 is formed on the surface of the second P-typed substrate 111. Also, the second ohmic contact electrode 114 is grounded. The doped concentration, light-irradiating area are both the same with that of the first P-N diode 10, and the thickness Yn2 of the second P-N junction, however, is 2.0 μm. When a surface of a certain diode has deficiencies, the recombination rate of electron-hole pairs will increase, which makes the responsivity to light of short wavelengths decrease, and hence the difference of the responsivities between the certain diode having surface deficiencies and that having no surface deficiency will be more obvious. Therefore, a defective area 115 is formed on the second P-N diode 11 by an ion implantation or a reactive ion etching (RIE), and the concentration thereof is 1E12 $(cm^{-2})$.

In order to realize the affection of the anti-reflection layer 105 and the defective area 115 on the responsivity, a third P-N diode and a fourth P-N diode (which are not showed in this picture) are provided in addition. The third P-N diode and the fourth P-N diode are the same respectively with the first P-N diode 10 and the second P-N diode 11 except the anti-reflection layer 105 and the defective area 115. A reverse-biased Voltage of 1.1 volt is respectively applied to the four P-N diodes mentioned above, and meanwhile, the four P-N diodes are also irradiated by light 120, of which the wavelengths are within the spectrum from 300 nm to 1100 nm and the power is 1 μW. The corresponding responsivities are measured and recorded as follows.

Figure 2:
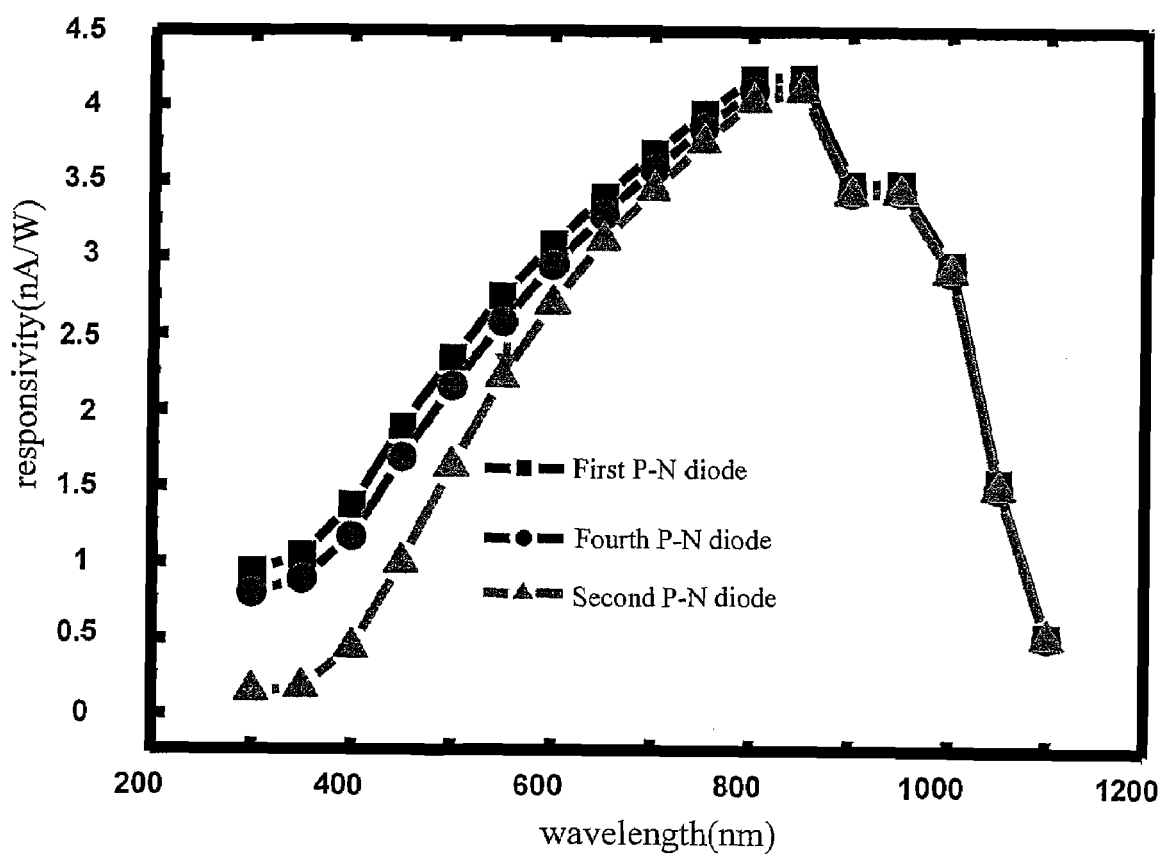
FIG. 2 is a diagram of curve showing the responsivity of each P-N diode according to the first preferred embodiment of the present invention in varied wavelength.

Please refer to FIG. 2, which is a diagram of curve showing the responsivity of each P-N diode according to the first preferred embodiment of the present invention in varied wavelength. It is noted that the reponsivities of the second, the third and the fourth P-N diodes to infrared (of which the wavelength is over 800 nm) are almost the same. However, the responsivities of the second and the fourth P-N diodes to visible light decay because of deeper thicknesses of the P-N junctions. The decay of responsivity of the second P-N diode to visible light is especially obvious because of having the defective area 115.

Figure 3:
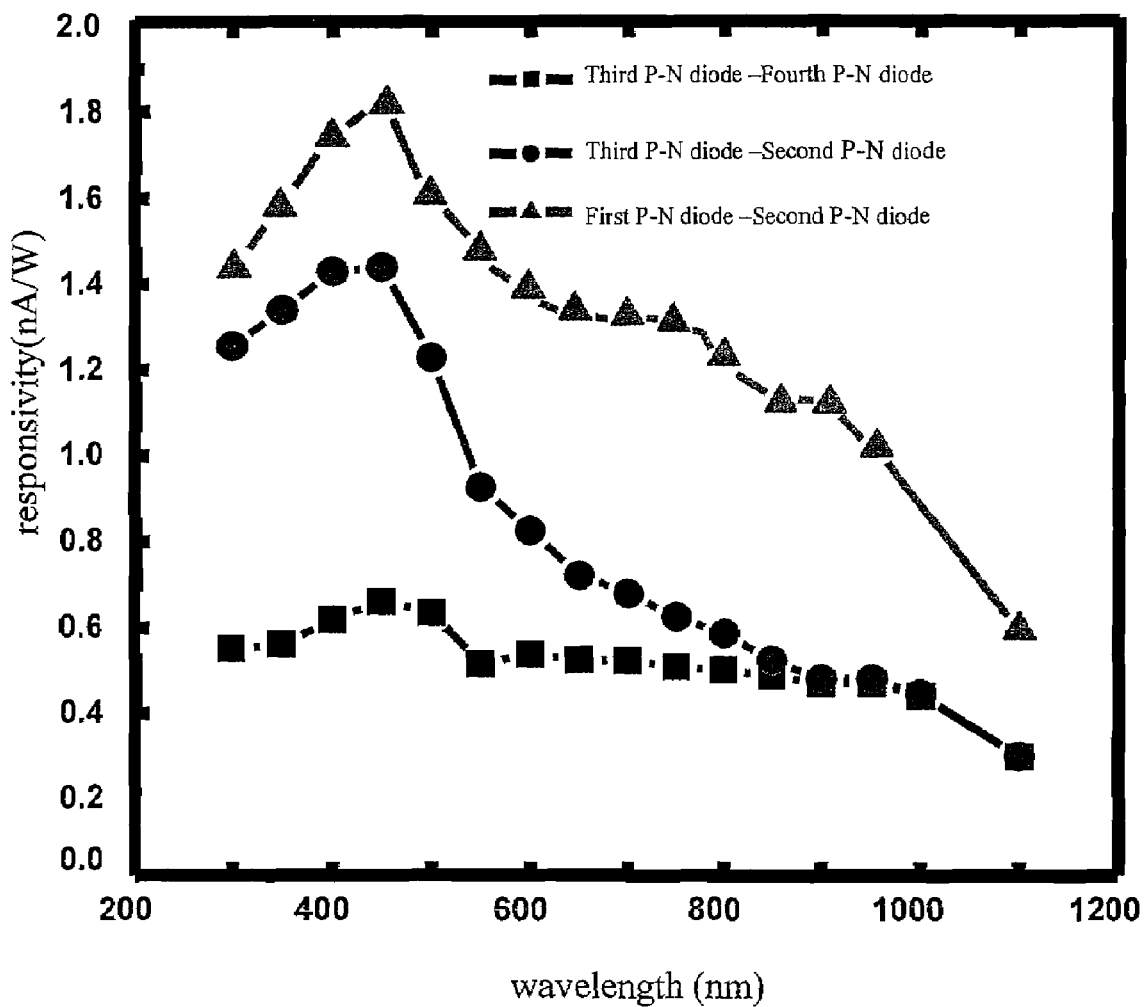
FIG. 3 is a diagram of curve showing the subtracting results between the responsivitiy of each diode according to the first preferred embodiment of the present invention.

Further, pleases refer to FIG. 3, which is a diagram of curve showing the subtracting results between responsivity of each diode according to the first preferred embodiment of the present invention. It is clear that the first P-N diode 10 has a well responsivity to visible light because of the anti-reflection layer 105 thereon, and when subtracting the responsivity of the second P-N diode 11 from that of the first P-N diode 10, it is found a well peak of responsivity to light of short wavelength (about 450 nm). When comparing with the curve of subtracting the responsivity of the second P-N diode 11 from the that of the third P-N diode 11, and the curve of substracting the responsivity of the fourth P-N diode 10 from the that of the third P-N diode 11, it is obvious that the photosensor 01 of the present invention indeed has a well ability on detecting visible light.

Figure 4:
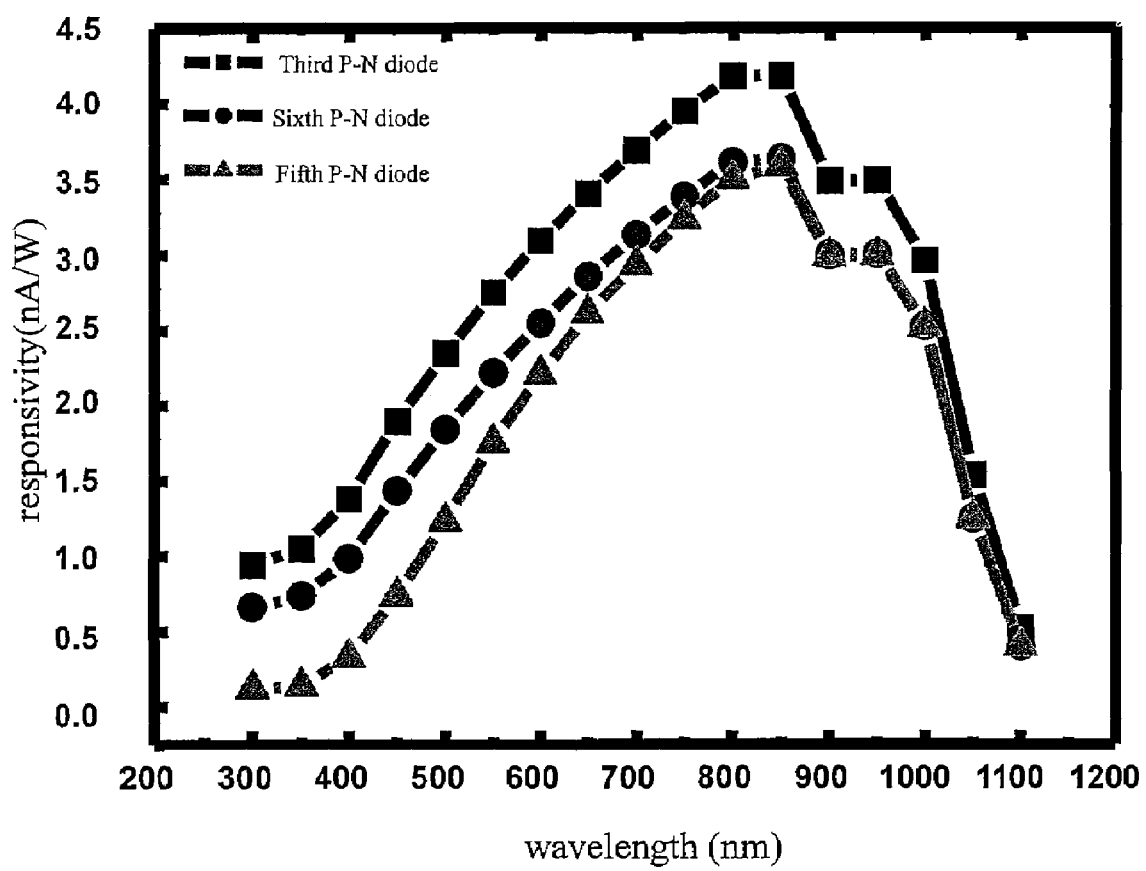
FIG. 4 is a diagram of curve showing the responsivity of each P-N diode according to the second preferred embodiment of the present invention in varied wavelength.

Please refer to FIG. 4, which is a diagram of curve showing the responsivity of each P-N diode according to the second preferred embodiment of the present invention in varied wavelength. As to the second preferred embodiment, a fifth P-N diode is provided to replace the second P-N diode. The structure and characters of the fifth P-N diode are the same with those of the second P-N diode except the thickness Yn5 of a fifth P-N junction of the fifth P-N diode is 4.0 μm. Meanwhile, in order to realize the affection of the surface deficiencies to the responsivity, a sixth P-N diode is provided to replace the fourth P-N diode. The structure and characters of the sixth P-N diode are the same with those of the fourth P-N diode except the thickness Yn6 of a sixth P-N junction of the sixth P-N diode is 4.0 μm. As FIG. 4 shows, it is noted that the responsivity will decay more obviously as the thickness increases, and after the defective area is formed, the difference between the responsivities of the fifth and the first P-N diode could be further increased.

Figure 5:
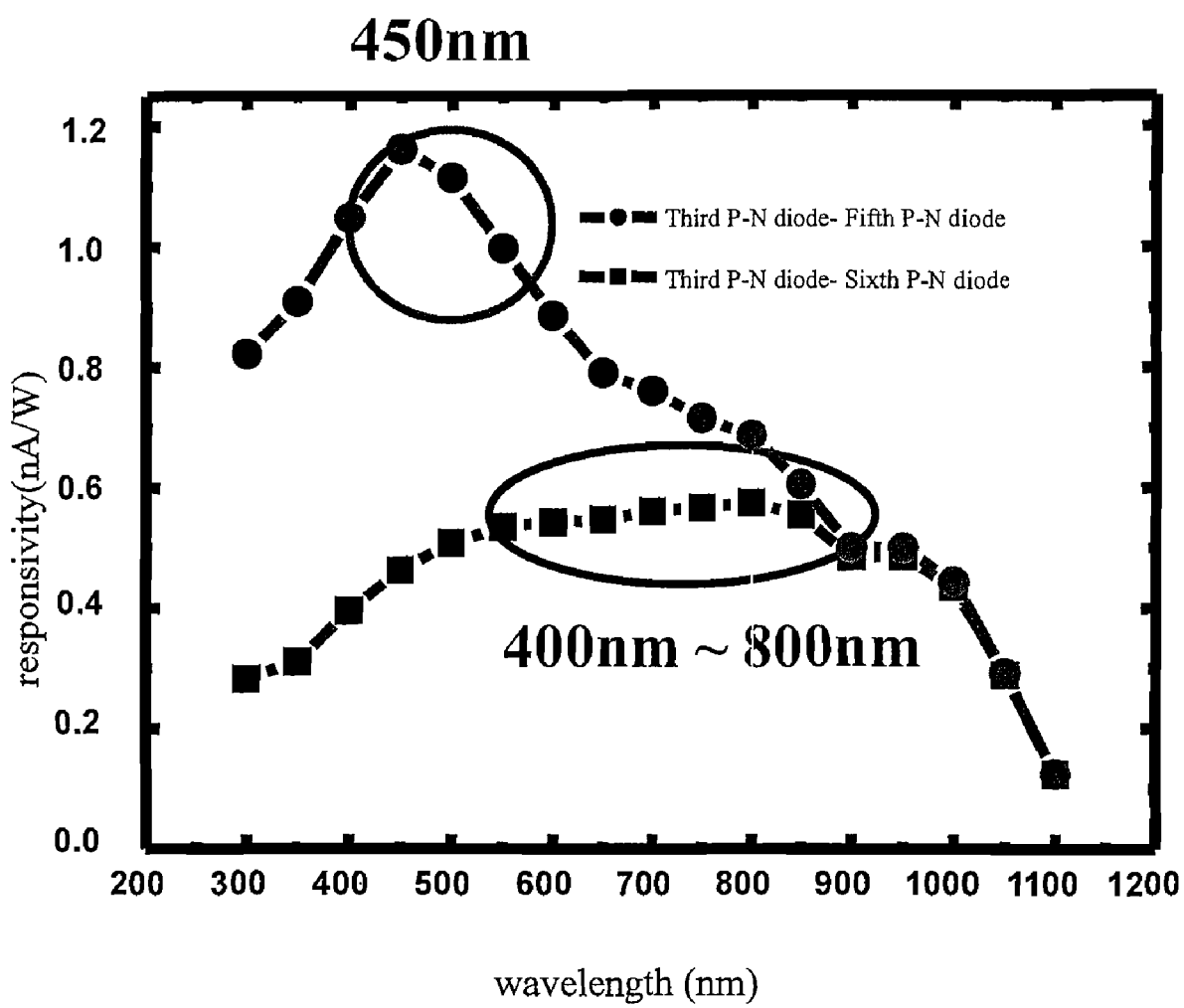
FIG. 5 is a diagram of curve showing the subtracting results between the responsivity of each diode according to the second preferred embodiment of the present invention.

Please refer to FIG. 5, which is a diagram of curve showing the subtracting results between responsivity of each diode according to the second preferred embodiment of the present invention. As FIG. 5 shows, when combining the third P-N diode and the sixth P-N diode as a photosensor, which means subtracting the responsivity of the sixth P-N diode from that of the third P-N diode, it is found that there exists a broad peak of the responsivity to visible light (within the spectrum from 400 nm to 800 nm). It is to say that the combination of the third P-N diode and the sixth P-N diode could form a photosensor having a well sensitivity to visible light, and the combination of the third P-N diode and the fifth P-N diode could form a photosensor having a great sensitivity to visible light of short wavelength.

From the mention above, based on the principle of the depletion region having different thickness or depth, absorbing light of different wavelength, the present invention combines at least two diodes of which the junctions have different thickness to obtain a photosensor, and the electrical signals generated by respective diodes will be further processed, to make the photosensor have a well sensitivity to visible light but not the infrared. Meanwhile, the P-typed substrate 101 or 111 could be substituted with the N-typed substrate, and a P well could be formed on the N-typed substrate. The doped concentration could be adjusted based on needs. Further, the silicon substrate could be changed with {100}, {101} and {102} germanium substrates, and the diodes could be PN diodes, PIN diodes, MIS diodes, or MSM diodes.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A photodetecting device, comprising:
    a first P-N diode, having a first P-N junction which has a first thickness, by which a first electrical signal is generated when irradiated by light; and
    a second P-N diode, having a second P-N junction which has a second thickness, by which a second electrical signal is generated when irradiated by light,
    wherein the first and the second P-N diodes respectively have a first and a second substrates and are separate from each other, the first P-N diode further comprises a surface having an anti-reflection layer disposed thereon, the second P-N diode further comprises a surface having a defective area formed thereon, the second thickness is larger than the first thickness, and an operation of the first electrical signal and the second electrical signal is proceeded for obtaining a third electrical signal.

2. The photodetecting device according to claim 1, wherein the P-N diodes comprise an N-type well formed on a P-type substrate.

3. The photodetecting device according to claim 1, wherein the first and the second P-N diodes are silicon-based P-N diodes formed by one of P-type silicon substrate and N-type silicon substrate.

4. The photodetecting device according to claim 1, wherein the P-N diodes are germanium-based P-N diodes formed by one selected from a group consisting of {100}, {110} and {111} germanium substrates.

5. The photodetecting device according to claim 1, wherein the P-N diodes are ones selected from a group consisting of PN diodes, PIN diodes, MIS diodes and MSM diodes.

6. The photodetecting device according to claim 1, wherein the first thickness is ranged from 10 nm to 3 μm and the second thickness is ranged from 10 nm to 4 μm.

7. The photodetecting device according to claim 1, wherein the anti-reflection layer is made of one of SiO2 and Si3N4.

8. The photodetecting device according to claim 1, wherein the defective area is formed by one of an ion implantation and a reactive ion etching (RIE).

9. The photodetecting device according to claim 1, wherein the first P-N diode has a light receiving area equal to that of the second P-N diode.

10. The photodetecting device according to claim 1, wherein the first P-N diode has a doping concentration equal to that of the second P-N diode.

11. The photodetecting device according to claim 1, further comprising an operation circuit.

12. The photodetecting device according to claim 1, wherein the operation is a subtraction operation.

13. The photodetecting device according to claim 1, further comprising an ohmic contact electrode on respective surfaces of the first P-N diode and the second P-N diode.

14. A photodetecting sensor, comprising:
    a first photodetector, having a first junction having a first thickness, by which a first electrical signal is generated when irradiated by light; and
    a second photodetector, having a second junction having a second thickness, by which a second electrical signal is generated when irradiated by light,
    wherein the first and the second photodetectors are two independent diodes, the first photodetector further comprises a surface having an anti-reflection layer disposed thereon, the second photodetector further comprises a surface having a defective area formed thereon, and the second thickness is larger than the first thickness.

15. The photodetecting sensor according to claim 14, wherein the first photodetector and the second photodetector are selected from a group consisting of PN diodes, PIN diodes, MIS diodes, and MSM diodes.

16. The photodetecting sensor according to claim 14, further comprises an operation circuit.

* * * * *